(12) United States Patent
Kurihara et al.

(10) Patent No.: US 6,731,187 B2
(45) Date of Patent: May 4, 2004

(54) DUAL MODE PIEZOELECTRIC FILTER WITH A RELAY ELECTRODE ON THE CASING SUBSTRATE

(75) Inventors: Takahiro Kurihara, Shinminato (JP); Masao Gamo, Takaoka (JP); Yoshihiro Ikeda, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 166 days.

(21) Appl. No.: 10/092,494

(22) Filed: Mar. 8, 2002

(65) Prior Publication Data

US 2002/0149446 A1 Oct. 17, 2002

(30) Foreign Application Priority Data

Apr. 6, 2001 (JP) .................................. 2001-109330
Dec. 20, 2001 (JP) .................................. 2001-387076

(51) Int. Cl.$^7$ .............................. H03H 9/54; H03H 9/58; H03H 9/60
(52) U.S. Cl. ..................... 333/189; 333/192; 310/321; 310/348; 310/366
(58) Field of Search ................ 333/186–192; 310/321, 348, 366

(56) References Cited

U.S. PATENT DOCUMENTS 4,365,181 A * 12/1982 Yamamoto .................. 310/320
5,898,348 A * 4/1999 Ikeda ......................... 333/191
5,939,956 A * 8/1999 Arimura et al. ............. 333/189
6,160,462 A * 12/2000 Sugiyama et al. .......... 333/189

FOREIGN PATENT DOCUMENTS

| JP | 6-6175 | * 1/1994 | .................. 333/191 |
| JP | 9-46170 | * 2/1997 | |
| JP | 11-68510 | * 3/1999 | |

* cited by examiner

Primary Examiner—Barbara Summons
(74) Attorney, Agent, or Firm—Keating & Bennett, LLP

(57) ABSTRACT

A dual mode filter includes a casing substrate on which an input electrode, an output electrode, two ground electrodes, and a relay electrode are provided, first and second filter elements mounted in parallel with each other on the casing substrate, and a cap fixed onto the casing substrate. The first and second filter elements each include a first terminal electrode, a second terminal electrode, a pair of segmented electrodes, a counter electrode, and a third terminal electrode. The first terminal electrode of the first filter element is connected to the input electrode, and the third terminal electrode is connected to one ground electrode. The first terminal electrode of the second filter element is connected to the output electrode, and the third terminal electrode is connected to the other ground electrode. The second terminal electrodes of the first and second filter elements are connected to the relay electrode.

20 Claims, 13 Drawing Sheets

DUAL MODE PIEZOELECTRIC FILTER WITH A RELAY ELECTRODE ON THE CASING SUBSTRATE

BACKGROUND OF THE INVENTION

1. Field of the Invention

The present invention relates to dual mode filters, and more specifically, to a surface-mounted dual mode filter.

2. Description of the Related Art

Well-known dual mode filters including a filter element that is disposed in a package defined by a casing substrate and a conductive cap have been widely used.

FIG. 18 illustrates the structure of a well-known dual mode filter.

In the dual mode filter, an input electrode 51, an output electrode 52, and a ground electrode 53 are provided on a casing substrate 50. These electrodes 51 to 53 are arranged so as to wrap around the casing substrate 50 from the top surface to the bottom surface. On the top surface of the casing substrate 50, a rectangular-frame shaped insulating layer 54 is provided. As described in Japanese Unexamined Utility Model Application Publication No. 5-25832, a filter element 60 is a piezoelectric resonator defined by connecting a plurality of piezoelectric vibrators via relay capacitors. The filter element 60 includes a composite substrate defined by bonding piezoelectric substrates 61 and 62 having piezoelectric characteristics to a dielectric substrate 63 having dielectric characteristics but no piezoelectric characteristics. Vibrators 64 and 65 are provided on the piezoelectric substrates 61 and 62, respectively. The vibrators 64 and 65 simultaneously generate two oscillation modes, particularly, a symmetric mode (S mode) and an asymmetric mode (A mode), between a pair of segmented electrodes provided on a first principal surface and a counter electrode provided on a second principal surface.

On the top surface of the filter element 60, terminal electrodes 66 and 67 are provided at both ends thereof. A capacitance extraction electrode 68 is provided at a central portion of the top and bottom surfaces of the filter element 60. Since the capacitance extraction electrodes 68 are provided on the dielectric substrate 63, undesired vibrations in a relay capacitance section are prevented from occurring. The terminal electrodes 66 and 67 on the filter element 60 are connected to the input and output electrodes 51 and 52 on the casing substrate 50 via conductive paste 69a and 69b, respectively. The capacitance extraction electrodes 68 are connected to the ground electrode 53 on the casing substrate 50 via a conductive paste 69c.

After mounting the filter element 60 on the casing substrate 50, silicone rubber 70 is applied to the top surface of the filter element 60. A conductive cap 71 is attached to the insulating layer 54 so as to cover the filter element 60, and the interior is sealed. Accordingly, a surface-mounted dual mode filter is obtained.

In the dual mode filter structured described above, the two vibrators 64 and 65 are integrally provided on one element. Interference between the two vibrators 64 and 65 causes undesired vibrations.

FIG. 19 shows amplitude characteristics of the dual mode filter described above. As shown in FIG. 19, an in-band ripple R is generated by the interference between the vibrators 64 and 65. Further, out-of-band attenuation is relatively small.

In this known structure, two vibrators are provided on one element. Thus, a single composite substrate must be formed by integrally bonding the piezoelectric substrates 61 and 62 and the dielectric substrate 63. As a result, the manufacturing costs are increased, and the reliability of the electrodes at the boundary between the substrates is reduced.

SUMMARY OF THE INVENTION

In order to overcome the above-described problems, preferred embodiments of the present invention provide a dual mode filter in which undesired vibrations due to interference between vibrators are prevented from occurring, which has greatly reduced manufacturing costs, and which has greatly increased connection reliability.

According to a first preferred embodiment of the present invention, a dual mode filter includes a casing substrate on which an input electrode, an output electrode, two ground electrodes, and a relay electrode are provided, first and second filter elements mounted on the casing substrate, and a cap connected to and fixed on the casing substrate so as to cover the filter elements. Each of the first and second filter elements includes a first terminal electrode at a first end of a first principal surface of a piezoelectric substrate, a second terminal electrode in a central portion of the piezoelectric substrate, a pair of segmented electrodes provided in a portion of the piezoelectric substrate between the first and second terminal electrodes and which are connected to the first and second terminal electrodes, respectively, a counter electrode provided on a second principal surface of the piezoelectric substrate and which is opposed to the segmented electrodes to define a dual mode vibrator, and a third terminal electrode provided at a second end of the piezoelectric substrate and which is connected to the counter electrode. The first terminal electrode of the first filter element is connected to the input electrode on the casing substrate via a conductive bonding material, and the third terminal electrode is connected to one ground electrode on the casing substrate via a conductive bonding material. The first terminal electrode of the second filter element is connected to the output electrode on the casing substrate via a conductive bonding material, and the third terminal electrode is connected to the other ground electrode on the casing substrate via a conductive bonding material. The second terminal electrode of the first filter element is connected to the relay electrode on the casing substrate via a conductive bonding material, and the second terminal electrode of the second filter element is connected to the relay electrode on the casing substrate via a conductive bonding material.

According to preferred embodiments of the present invention, instead of providing two vibrators on one element, one dual-mode vibrator is provided on each of the two elements. These two elements are spaced a desired distance from each other on the casing substrate and are connected to each other through the relay electrode on the casing substrate. Thus, undesired vibrations due to interference between the two vibrators are prevented.

It is unnecessary to form a composite substrate by integrally bonding a piezoelectric substrate and a dielectric substrate. Thus, the manufacturing costs are greatly reduced. The dual mode filter according to preferred embodiments of the present invention does not have reduced reliability of electrodes at the boundary between the two substrates.

Since the relay electrode is provided on the casing substrate, the relay electrode is not opposed to the filter elements with the ground electrodes and the piezoelectric substrate therebetween. Thus, undesired vibrations are efficiently suppressed.

Preferably, the first and second filter elements are mounted such that each first terminal electrode, each second terminal electrode, and each pair of segmented electrodes face the casing substrate side. In other words, preferably, the first and second filter elements are mounted such that each counter electrode and each third terminal electrode face upward.

When connecting the first terminal electrodes of the filter elements to the input electrode and the output electrode by the conductive bonding materials and when connecting the second terminal electrodes to the relay electrode via the conductive bonding materials, with these electrodes facing upward (opposite to the casing substrate side), the conductive bonding material, such as a conductive paste or soldering, must continuously be applied to portions from the terminal electrodes on the top surface of each filter element to the electrodes on the casing substrate. In particular, it is difficult to connect the second terminal electrodes to the relay electrode. In other words, because each second terminal electrode is provided in a central portion of each filter element, the second terminal electrode is near the vibrator. When a large amount of conductive bonding material is applied, the conductive bonding material may reach the vibrator.

In contrast, when the first terminal electrodes and the second terminal electrodes are mounted to face toward the casing substrate side, the second terminal electrodes is connected face-to-face to the relay electrode on the casing substrate via the conductive bonding material. Thus, the connection is simplified, and the connection reliability is greatly improved.

Preferably, the second terminal electrodes of the first and second filter elements are each arranged at a position near a first edge of the first principal surface of the piezoelectric surface so as not to oppose the electrodes provided on the second principal surface of the piezoelectric substrate, and the first filter element and the second filter element are arranged next to each other on the casing substrate such that the second terminal electrodes are opposed to each other.

When each second terminal electrode has a width that is substantially equivalent to the width of each filter element, the second filter element is opposed to the lead electrode connecting the counter electrode and the third terminal electrode provided on the second principal surface with the piezoelectric substrate therebetween. In the opposed portion, undesired vibrations may occur.

In order to prevent the second terminal electrode from being opposed to the electrodes provided on the second principal surface, the second terminal electrode is provided at a position near the first edge of the first principal surface of the piezoelectric substrate, thus preventing undesired vibrations from occurring. The first and second filter elements are arranged next to each other on the casing substrate such that the second terminal electrodes, which are provided at the positions near the edges, are opposed to each other, thus the length of the dual mode filter according to preferred embodiments of the present invention is greatly reduced. Further, the relay electrode is shortened, and hence the width of the dual mode filter is reduced.

As a result, the size of the compact dual mode filter is greatly reduced.

Preferably, a thickness Ta of the first filter element differs from a thickness Tb of the second filter element, or a width Wa of the first filter element differs from a width Wb of the second filter element.

Vibrating electrodes of each filter element preferably include the segmented electrodes and the counter electrode opposed thereto. Vibrations are generated between these electrodes, thereby achieving desired filter characteristics. Actually, however, undesired vibrations occur between the counter electrode and the lead electrode connecting the segmented electrode and the terminal electrode. Also, undesired vibrations occur between the segmented electrodes and the lead electrode connecting the counter electrode and the third terminal electrode. These undesired vibrations are thickness mode vibrations and appear as ripples on the main waveform of the filter.

By making at least one of the thickness and the width of the first filter element different from that of the second filter element, a frequency at which undesired vibrations occur in one element is different from that in the other element. Thus, interference between the undesired vibrations is effectively prevented, and ripples are greatly reduced as compared with a case in which the thickness and the width of one filter element are the same as those of the second filter element.

The thickness Ta of the first filter element and the thickness Tb of the second filter element preferably satisfies one of the following inequalities:

$$Tb<Ta<1.01Tb, \text{ and}$$

$$0.99Tb<Ta<Tb.$$

In other words, by maintaining the difference in thickness between the two filter elements within approximately 1%, the difference between the resonant frequencies of the two filter elements is maintained within approximately 1%. When the difference between the resonant frequencies of the two filter elements is greater than or equal to about 1%, the band width ratio (pass band width/fo) decreases suddenly, and the balance between a symmetric mode (S mode) and an asymmetric mode (A mode) produced by the two elements substantially deteriorates. As a result, the main waveform is segmented.

The width Wa of the first filter element and the width Wb of the second filter element preferably satisfies one of the following inequalities:

$$Wb<Wa<1.05\ Wb, \text{ and}$$

$$0.9Wb<Wa<Wb$$

In the width mode, ripples periodically occur at a ratio between the element thickness and the element width, and an appropriate width region periodically occurs. By changing the width while keeping the difference in width between the two elements within approximately 5%, ripples are efficiently reduced.

A distance La1 from the midpoint between the segmented electrodes of the first filter element to a first end in the longitudinal direction, a distance La2 from the midpoint to a second end in the longitudinal direction, a distance Lb1 from the midpoint between the segmented electrodes of the second filter element to a first end in the longitudinal direction, and a distance Lb2 from the midpoint to a second end in the longitudinal direction preferably satisfies one of the following inequalities:

$$0<|La1-Lb1|<2t, \text{ and}$$

$$0<|La2-Lb2|<2t,$$

wherein t represents the greater of the thickness Ta of the first filter element and the thickness Tb of the second filter element.

Propagating waves which are generated by the vibrating electrodes and which propagate in the longitudinal direction are reflected from a narrow-side edge of each filter element and interfere with other vibrations, thus causing large ripples and spurious responses. By changing the distance from the vibrating electrodes to the narrow-side edge, a frequency at which undesired vibrations occur in one filter element is different from that in the other filter element. Since there is no interference between the undesired vibrations, ripples and spurious responses are greatly reduced as compared with a case in which the distances La1, La2, Lb1, and Lb2 are the same.

By changing the ratio between La1:La2 and Lb1:Lb2, the advantages are even greater.

A distance Ha1 between the first lead electrode of the first filter element and a first edge of the first filter element in the longitudinal direction and a distance Ha2 between the second lead electrode of the first filter element and the first edge of the first filter element in the longitudinal direction preferably differs from a distance Hb1 between the first lead electrode of the second filter element and a first edge of the second filter element in the longitudinal direction and a distance Hb2 between the second lead electrode of the second filter element and the first edge of the second filter element in the longitudinal direction, respectively.

As described above, when undesired thickness-mode vibrations occur, the vibrations are reflected from a long-side edge of each element and interfere with other vibrations, thus causing large ripples and spurious responses. By changing the positions of the lead electrodes of the two filter elements, a frequency at which undesired vibrations occur in one filter element is different from that in the other filter element. Hence, the interference between the undesired vibrations is prevented, and ripples and spurious responses are greatly reduced.

The distance Ha1, the distance Ha2, the distance Hb1, the distance Hb2, and the width W of one of the first and second filter elements may satisfy the following relationship:

$0<|Ha1-Hb1|<W/4$, and $0<|Ha2-Hb2|<W/4$, wherein W represents the greater of the width Wa of the first filter element and the width Wb of the second filter element.

Specifically, there are cases where strong vibrations are caused by the lead electrodes, whereas in other cases weaker vibrations are caused by the lead electrodes. This depends upon the positions of the lead electrodes of the filter elements. Thus, it is important to adjust the positions of the lead electrodes of the two filter elements within an area in which weaker vibrations are caused by the lead electrodes. By maintaining the difference between the lead electrodes within about W/4, ripples are efficiently suppressed.

A distance Ja between the third lead electrode of the first filter element and a first edge of the first filter element in the longitudinal direction preferably differs from a distance Jb between the third lead electrode of the second filter element and a first edge of the second filter element in the longitudinal direction.

In this case, as described above, undesired thickness-mode vibrations are reflected from a long-side edge of each filter element and interfere with other vibrations, thus causing large ripples and spurious responses. By changing the positions of the third lead electrodes of the two elements, a frequency at which undesired vibrations occur in one filter element is different from that in the other filter element, and ripples and spurious responses are greatly reduced.

The distance Ja, the distance Jb, and the width W of one of the first and second filter elements preferably satisfy the following relationship:

$0<|Ja-Jb|<W/4$ wherein W represents the greater of the width Wa of the first filter element and the width Wb of the second filter element.

As described above, there are cases in which strong vibrations are caused by the lead electrodes, whereas in other cases weaker vibrations are caused by the lead electrodes. This depends upon the positions of the lead electrodes of the filter elements. Thus, it is important to slightly adjust the positions of the lead electrodes of the two filter elements within an area in which weaker vibrations are caused by the lead electrodes. By maintaining the difference between the lead electrodes within about W/4, ripples are efficiently suppressed.

The first and second lead electrodes and the third lead electrode of the first filter element are preferably provided at unopposed positions on top and bottom surfaces of the first filter element. The first and second lead electrodes and the third electrode of the second filter element are preferably provided at unopposed positions on top and bottom surfaces of the second filter element. A distance Da in the width direction between the first and second lead electrodes and the third lead electrode of the first filter element preferably differs from a distance Db in the width direction between the first and second lead electrodes and the third lead electrode of the second filter element.

Even when the lead electrode connecting the segmented electrode and the terminal electrode is not directly opposed to the lead electrode connecting the counter electrode and the terminal electrode, undesired vibrations occur due to stray capacitance. These vibrations are related to the thickness and produce ripples on the main waveform of the filter. By making the distance between the lead electrodes on the top and bottom surfaces of one filter element different from that in the other filter element, a frequency at which undesired vibrations occur in one filter element is different from that in the other filter element. Since these vibrations do not interfere with each other, the size of the ripples is greatly reduced as compared with a case in which the distance between the lead electrodes of one filter element is the same as that in the other filter element.

The casing substrate is preferably a dielectric multilayer member including a plurality of capacitance electrodes provided therein. At least one of the capacitance electrodes is connected to the relay electrode, and at least another one of the capacitance electrodes is connected to the ground electrodes.

In order to adjust filter characteristics, conventionally, a relay capacitor is connected between two dual mode vibrators. Since the relay capacitor is provided on an integral piezoelectric substrate, undesired vibrations occur. In order to solve this problem, a discrete capacitor component is mounted on the casing substrate and defines the relay capacitor. However, with this arrangement, the number of nodes is increased, and the reliability is reduced.

In contrast, according to preferred embodiments of the present invention, the relay capacitor is provided in the interior of the casing substrate. Unlike connecting a discrete component, connections are unnecessary, and hence the reliability is greatly improved. Since the relay capacitor is a built-in capacitor in the casing substrate, short-circuiting of the relay capacitor with other circuits is effectively prevented. Since the casing substrate has an area that is larger than that of each filter element, the area of a portion in which the capacitance electrodes are opposed to each other is increased, and an arbitrary relay capacitance is obtained.

Preferably, the casing substrate is quadrangular. The input electrode and the output electrode are provided at opposing corners of the casing substrate. The two ground electrodes are provided at the remaining opposing corners. The third terminal electrode of the first filter element is connected to one ground electrode on the casing substrate. The third terminal electrode of the second filter element is connected to the other ground electrode on the casing substrate.

By providing the outer electrodes at four corners of the casing substrate, the size of the casing substrate is greatly reduced. By arranging the input electrode and the output electrode at opposing corners, an influence of the stray capacitance generated between the input and the output is greatly reduced. Out-of-band attenuation is increased, and short-circuiting between the input and output electrodes is prevented.

According to preferred embodiments of the present invention, since two filter elements each having a single dual mode vibrator are mounted on a casing substrate with a separation therebetween and are connected to electrodes on the casing substrate, interference between the two vibrators is prevented, and undesired vibrations are prevented from occurring. Since two small filter elements are individually manufactured and mounted on the casing substrate, the manufacturing costs are greatly reduced as compared with a known dual mode filter using a composite substrate formed by integrally bonding a piezoelectric substrate and a dielectric substrate. Also, the dual mode filter according to preferred embodiments of the present invention does not suffer from the problem of reduced reliability of electrodes at the boundary between the two substrates. Since a relay electrode is provided on the casing substrate at a portion spaced from the filter elements, the relay electrode and the filter elements are not opposed to each other with ground electrodes and piezoelectric substrates therebetween. Thus, undesired vibrations are effectively prevented from occurring.

Other features, elements, characteristics and advantages of the present invention will become more apparent from the following detailed description of preferred embodiments thereof with reference to the attached drawings.

DETAILED DESCRIPTION OF PREFERRED EMBODIMENTS

FIGS. 1 to 6 show a dual mode filter according to a first preferred embodiment of the present invention.

Figure 1:
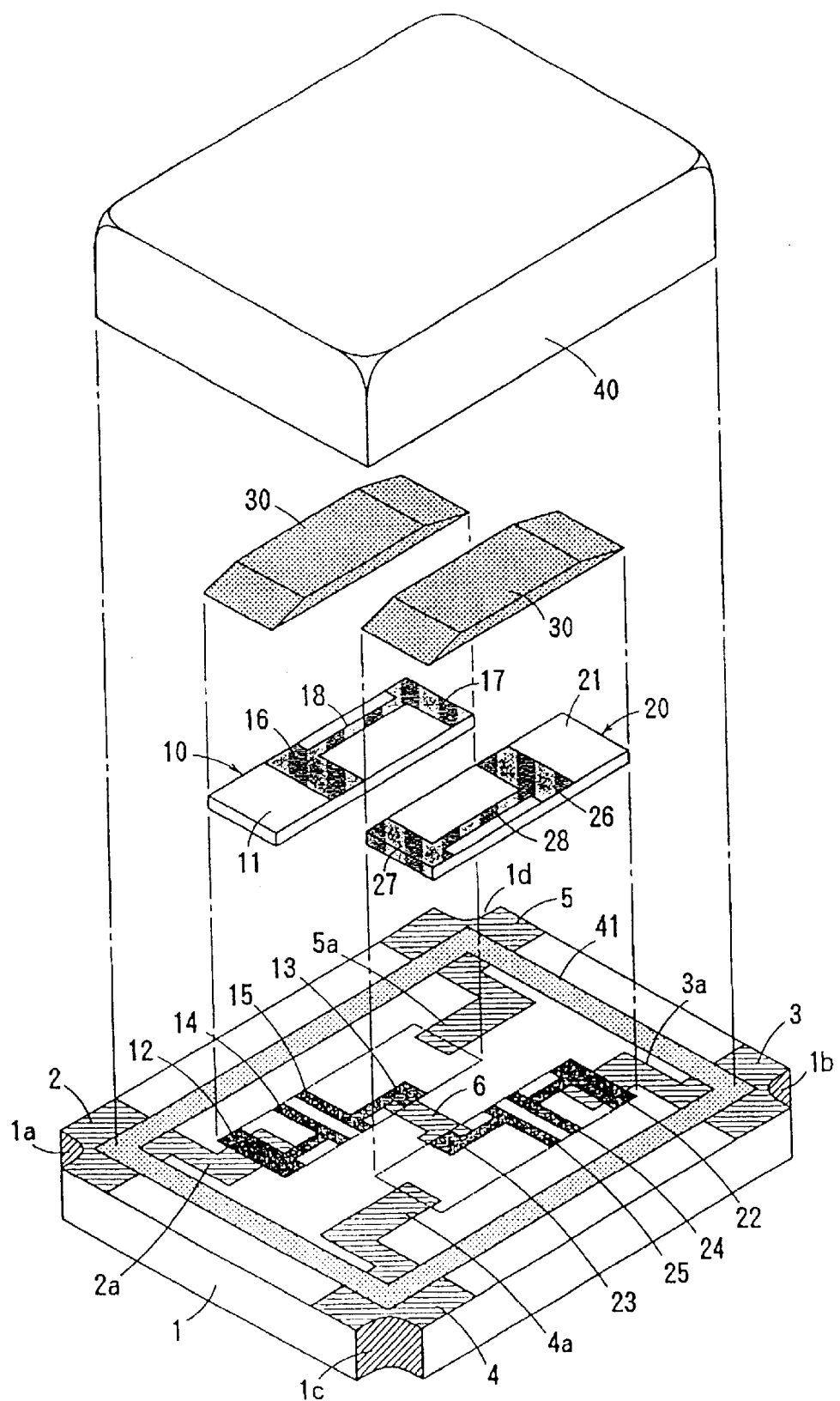
FIG. 1 is an exploded perspective view of a dual mode filter according to a first preferred embodiment of the present invention.

The dual mode filter is a surface-mounted type and includes an insulating casing substrate 1, two filter elements 10 and 20 arranged in parallel with each other on the casing substrate 1, damping members 30 preferably made of silicone rubber provided on the filter elements 10 and 20, and a metal cap 40 which is connected and fixed on the casing element 1 and which seals the filter elements 10 and 20. on the casing substrate 1 shown in FIG. 1, the electrode configuration on the bottom surface of the filter elements 10 and 20 is projected and shown.

The casing substrate 1 is a multilayer product defined by a plurality of dielectric ceramic layers which do not exhibit piezoelectric characteristics. The overall shape of the casing substrate 1 is substantially rectangular. At opposing corners of the top surface of the casing substrate 1, an input electrode 2 and an output electrode 3 are provided, respectively. At the remaining two opposing corners, ground electrodes 4 and 5 are provided, respectively. At four corners of the casing substrate 1, recesses 1a, 1b, 1c, and 1d are provided. The electrodes 2 to 5 extend to the back surface of the casing substrate 1 through the recesses 1a to 1d. The electrodes 2 to 5 extend toward the interior of the top surface of the casing substrate 1, and inner ends 2a to 5a of the electrodes 2 to 5 are connected to the filter elements 10 and 20.

Figure 3:
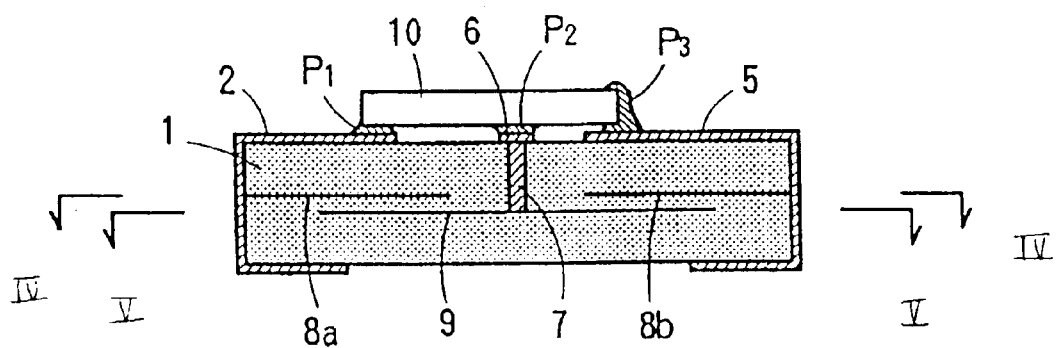
FIG. 3 is a middle sectional view of the dual mode filter shown in FIG. 2.

In a central portion of the top surface of the casing substrate 1, a relay electrode 6 defined by a strip extending in the narrow side direction is provided. The relay electrode 6 is connected to a top end of a through hole electrode 7 extending to a central portion of the casing substrate 1 in the thickness direction. As shown in FIG. 3, the through hole electrode 7 is formed by applying a conductive paste to a hole provided on the casing substrate 1.

Figure 4:
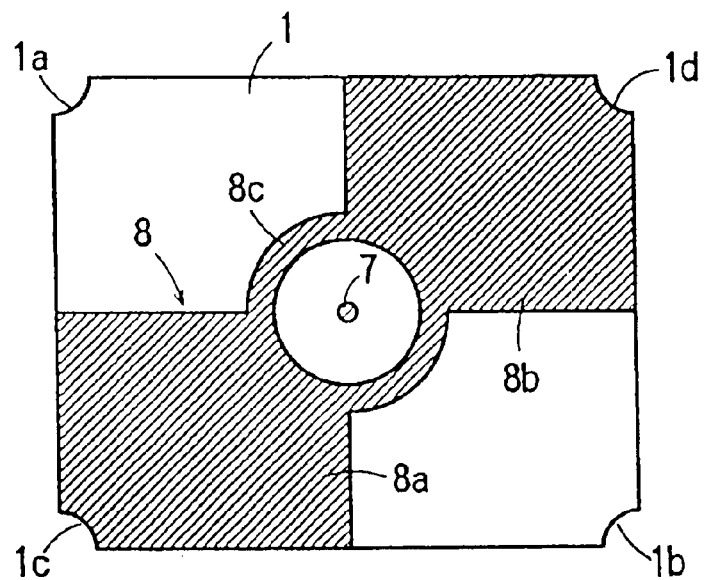
FIG. 4 is a sectional view taken along the line IV—IV of FIG. 3.
Figure 5:
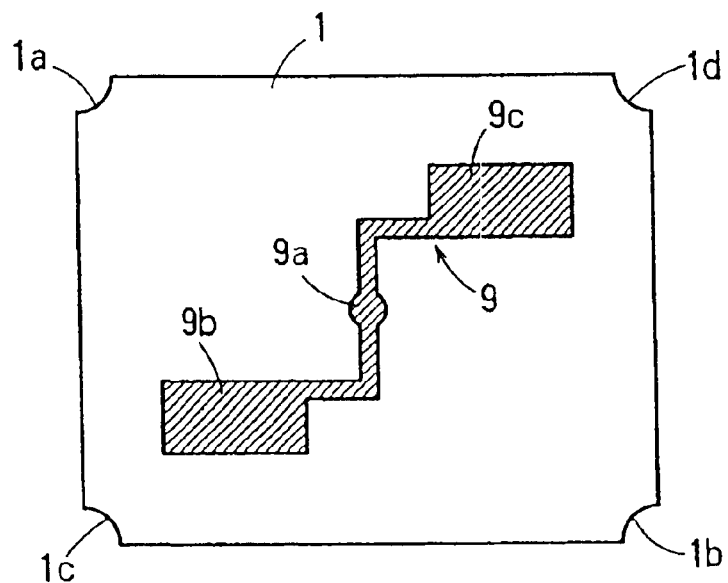
FIG. 5 is a sectional view taken along the line V—V of FIG. 3.

Two capacitance electrodes 8 and 9 are provided in the interior of the casing substrate 1. Referring to FIG. 4, the capacitance electrode 8 includes two electrode portions 8a and 8b extending to opposing edges of the casing substrate 1 and a connecting portion 8c that connects the electrode portions 8a and 8b. The electrode portions 8a and 8b are continuous with the ground electrodes 4 and 5 provided on the internal surfaces of the recesses 1c and 1d, respectively. The connecting portion 8c is disposed around the through hole electrode 7 such that the connecting portion 8c is spaced from through hole electrode 7. Referring to FIG. 5, the capacitance electrode 9 includes a center electrode portion 9a which is aligned with a lower end of the through hole electrode 7 and two electrode portions 9b and 9c extending from the center electrode portion 9a in a direction toward opposing corners of the casing substrate 1. The electrode portions 9b and 9c do not extend to the edges of the casing substrate 1. The electrode portions 8a and 8b of the capacitance electrode 8 are opposed to the electrode portions 9b and 9c of the capacitance electrode 9 with the dielectric ceramic layers therebetween, thus defining two relay capacitors C1 and C2. Although the two relay capacitors C1 and C2 are provided in the first preferred embodiment, alternatively, only one relay capacitor may be provided.

The filter elements 10 and 20 are resonators utilizing an energy-trap-type thickness shear vibration mode and have substantially the same shape. Although the resonant frequencies of the filter elements 10 and 20 are the same in the first preferred embodiment, the resonant frequencies may be different. The filter elements 10 and 20 include piezoelectric substrates 11 and 21 defined by substantially rectangular thin sheets made of piezoelectric ceramic (such as PZT (Pb(Zr—Ti)O$_3$). At first ends of first principal surfaces of the piezoelectric substrates 11 and 21, first terminal electrodes 12 and 22 are provided, respectively. In central portions, second terminal electrodes 13 and 23 are provided, respectively. In a portion between the terminal electrodes 12 and 13, a pair of segmented electrodes 14 and 15 is provided. The segmented electrode 14 is connected to the first terminal electrode 12, and the segmented electrode 15 is connected to the second terminal electrode 13. In a portion between the terminal electrodes 22 and 23, a pair of segmented electrodes 24 and 25 is provided. The segmented electrode 24 is connected to the first terminal electrode 22, and the segmented electrode 25 is connected to the second terminal electrode 23. On second principal surfaces of the piezoelectric substrates 11 and 21, counter electrodes 16 and 26 that oppose the segmented electrodes 14, 15, 24, and 25 are provided. At second ends of the piezoelectric substrates 11 and 21, third terminal electrodes 17 and 27 that are connected to the counter electrodes 16 and 26 via lead electrodes 18 and 28, respectively, are provided. The third terminal electrodes 17 and 27 are arranged so as to wrap around the edges of the piezoelectric substrates 11 and 21, respectively.

Among the above-described terminal electrodes, the second terminal electrodes 13 and 23 are provided at positions near first edges of the first principal surfaces of the piezoelectric substrates 11 and 21 so as not to oppose the counter electrodes 16 and 26 and the third terminal electrodes 17 and 27 provided on the second principal surfaces of the piezoelectric substrates 11 and 21 and the lead electrodes 18 and 28 connecting the counter electrodes 16 and 26 and the third terminal electrodes 17 and 27. Accordingly, in the filter elements 10 and 20, only the segmented electrodes 14, 15, 24, and 25 and the counter electrodes 16 and 26, which define dual mode vibrators, are opposed to each other with the piezoelectric substrates 11 and 21 therebetween. As described above, the dual mode vibrators simultaneously generate two vibration modes, particularly, the symmetric mode (S mode) and the asymmetric mode (A mode).

Figure 2:
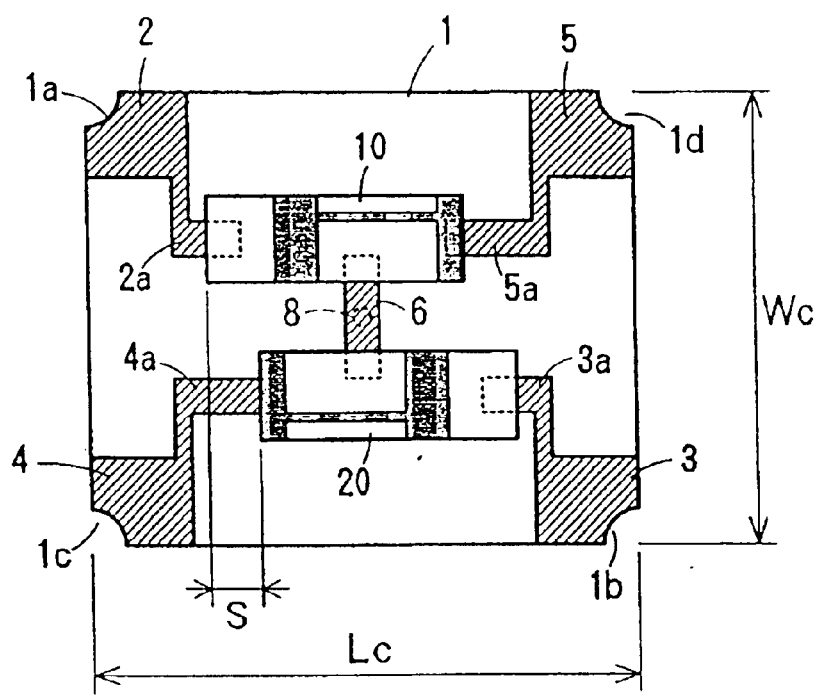
FIG. 2 is a plan view of the dual mode filter shown in FIG. 1 with a cap removed.

Referring to FIGS. 1 through 3, the first terminal electrode 12 of the filter element 10 is connected and fixed to the inner end (connected portion) 2a of the input electrode 2 via a conductive paste P1 while the filter element 10 and the casing substrate 1 are disposed at a desired distance (vibration space) from each other. The second terminal electrode 13 is connected and fixed to one end of the relay electrode 6 via a conductive paste P2. The third terminal electrode 17 is connected and fixed to the inner end (connected portion) 5a of the ground electrode 5 via a conductive paste P3. Among these terminal electrodes, the first terminal electrode 12 and the second terminal electrode 13 are connected face-to-face with the input electrode 2 and the relay electrode 6 via the conductive pastes P1 and P2, respectively. On the other hand, the third terminal electrode 17 is connected by applying the conductive paste P3 from above. In particular, the third terminal electrode 17 is arranged so as to wrap around the edge of the piezoelectric substrate 11, and thus the connection reliability is greatly improved.

Similarly, the first terminal electrode 22 of the filter element 20 is connected and fixed to the inner end (connected portion) 3a of the output electrode 3 via a conductive paste, the second terminal electrode 23 is connected and fixed to the other end of the relay electrode 6 via a conductive paste, and the third terminal electrode 27 is connected and fixed to the inner end (connected portion) 4a of the ground electrode 4 via a conductive paste.

Figure 18:
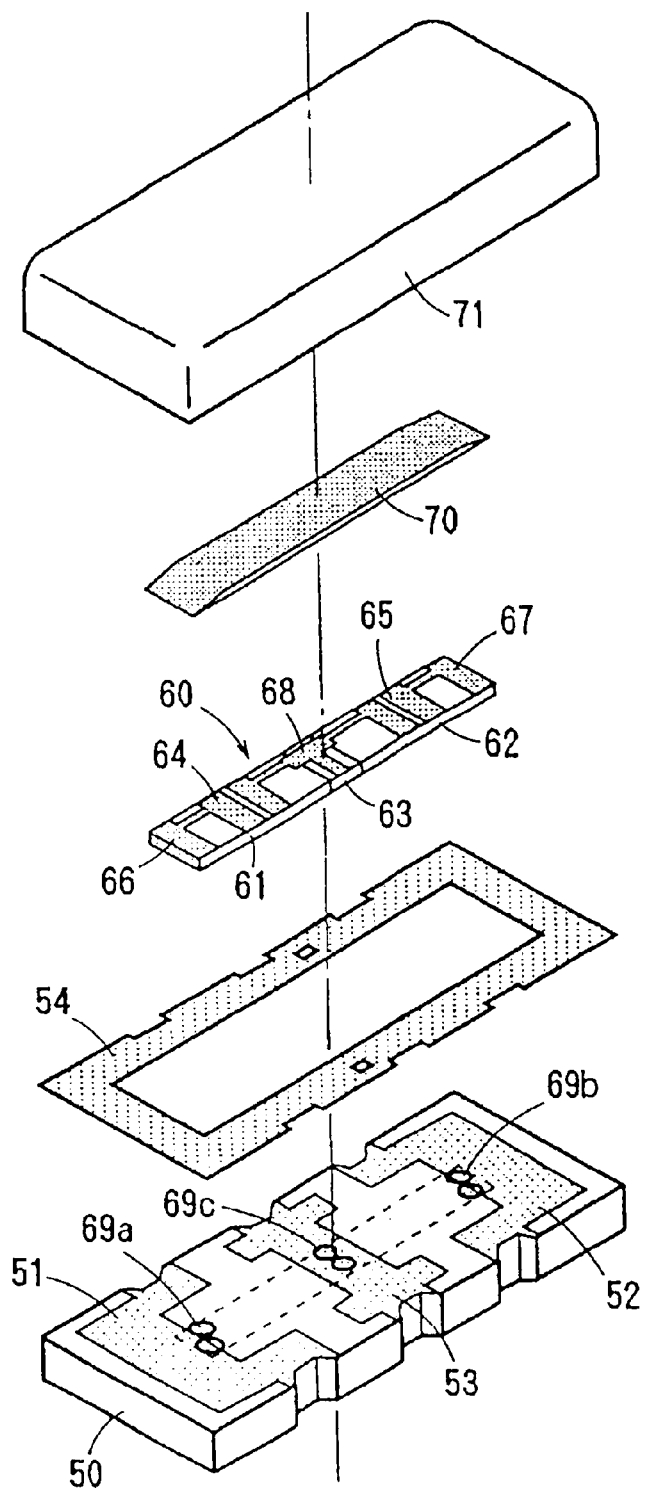
FIG. 18 is an exploded perspective view of an example of a well-known dual mode filter.
Figure 19:
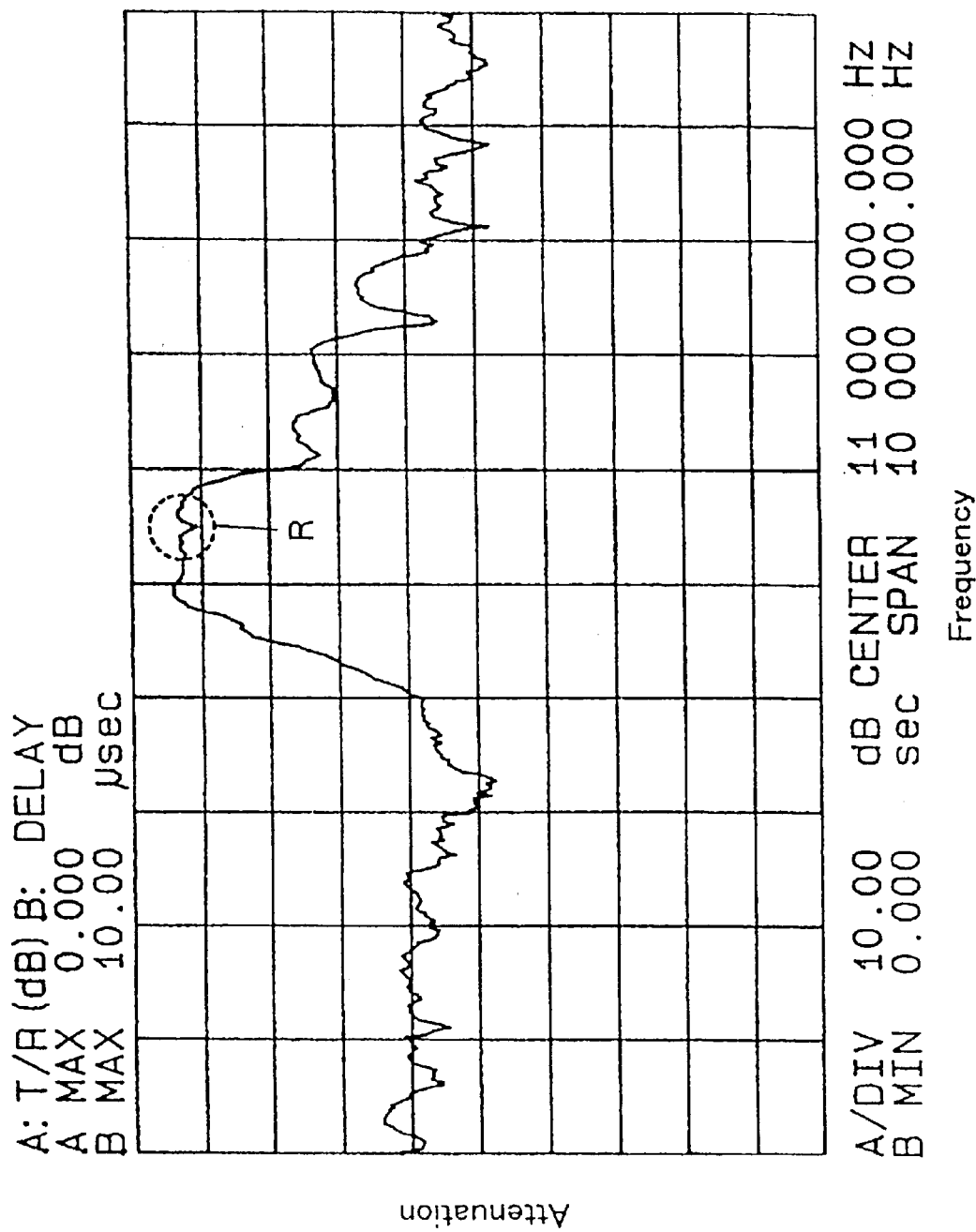
FIG. 19 is a diagram showing amplitude characteristics of the dual mode filter shown in FIG. 18.

The two filter elements 10 and 20 are mounted on the casing substrate 1 so as to be next to each other such that the segmented electrodes 14, 15, 24, and 25 are arranged to face toward the casing substrate 1 side and the second terminal electrodes 13 and 23 are opposed to each other. As compared with a conventional case as shown in FIG. 18 in which a long element having two vibrators is mounted on a casing substrate, the length Lc of the casing substrate 1 is reduced. In the first preferred embodiment, the two filter elements 10 and 20, which are arranged in parallel with each other, are spaced from each other in the longitudinal direction by a distance S (see FIG. 2). By changing the shape of the relay electrode 6, the two filter elements 10 and 20 can be arranged in parallel with each other without being displaced from each other in the longitudinal direction. In this case, the length Lc of the casing substrate is further reduced.

Although the width Wc of the casing substrate 1 is slightly greater than that of a well-known type, an increase in the width Wc is minimized by arranging the filter elements 10 and 20 close to one another.

Figure 6:
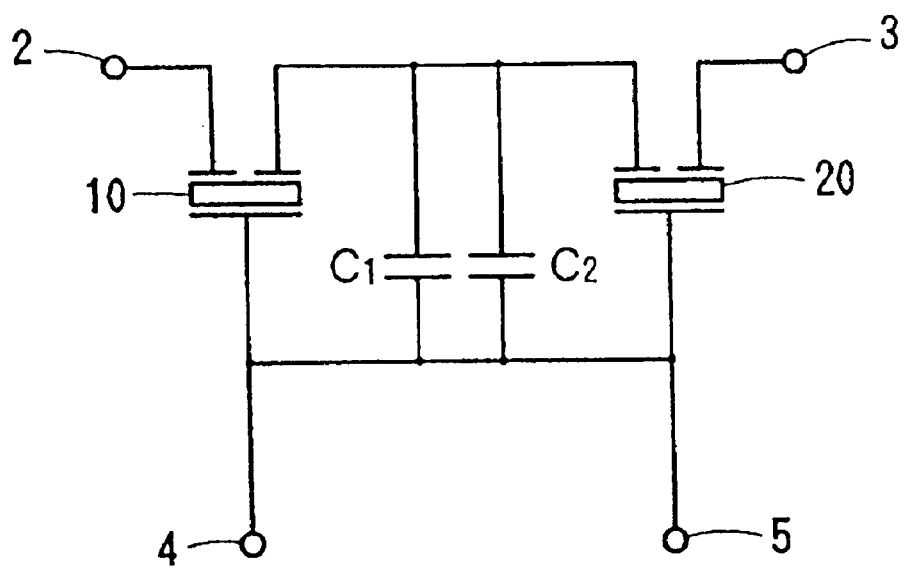
FIG. 6 is a circuit diagram of the dual mode filter shown in FIG. 1.

As described above, by mounting the two filter elements 10 and 20 on the casing substrate 1, as shown in the circuit diagram in FIG. 6, the dual mode filter having two dual mode vibrators and two relay capacitors C1 and C2 is obtained.

On the top surface of the casing substrate 1, an insulating layer 41 including, for example, a glass paste, is provided in the shape of a frame to surround a portion of the casing substrate 1 in which the filter elements 10 and 20 are mounted. An opening of the metal cap 40 is connected and fixed on the insulating layer 41, thus sealing the interior. Therefore, the interior of the metal cap 40 is shielded from flux and humidity, and the reliability of the dual mode filter is further improved.

The metal cap 40 may be electrically connected with the ground electrode 4 or 5 on the casing substrate 1. In this case, the dual mode filter additionally provides electromagnetic shielding.

Figure 7:
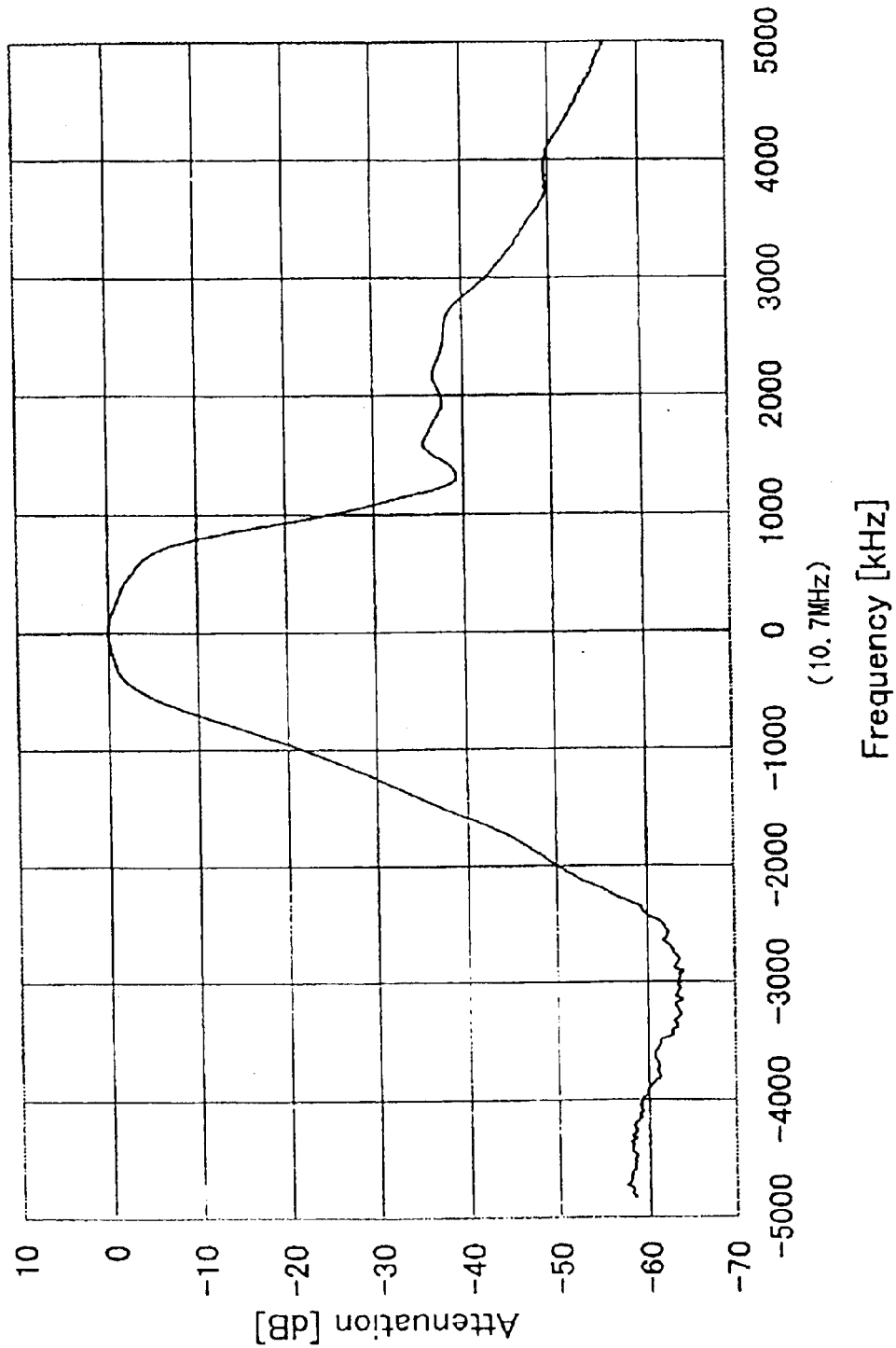
FIG. 7 is a diagram showing amplitude characteristics of the dual mode filter shown in FIG. 1.

FIG. 7 is a diagram showing amplitude characteristics of the dual mode filter described above. In the diagram, the band center frequency is about 10.7 MHz.

As is clear from FIG. 7, no undesired waveforms, such as ripples, are detected within the band, and satisfactory out-of-band attenuation is achieved. Thus, the dual mode filter has a highly desirable filter waveform.

Figure 8:
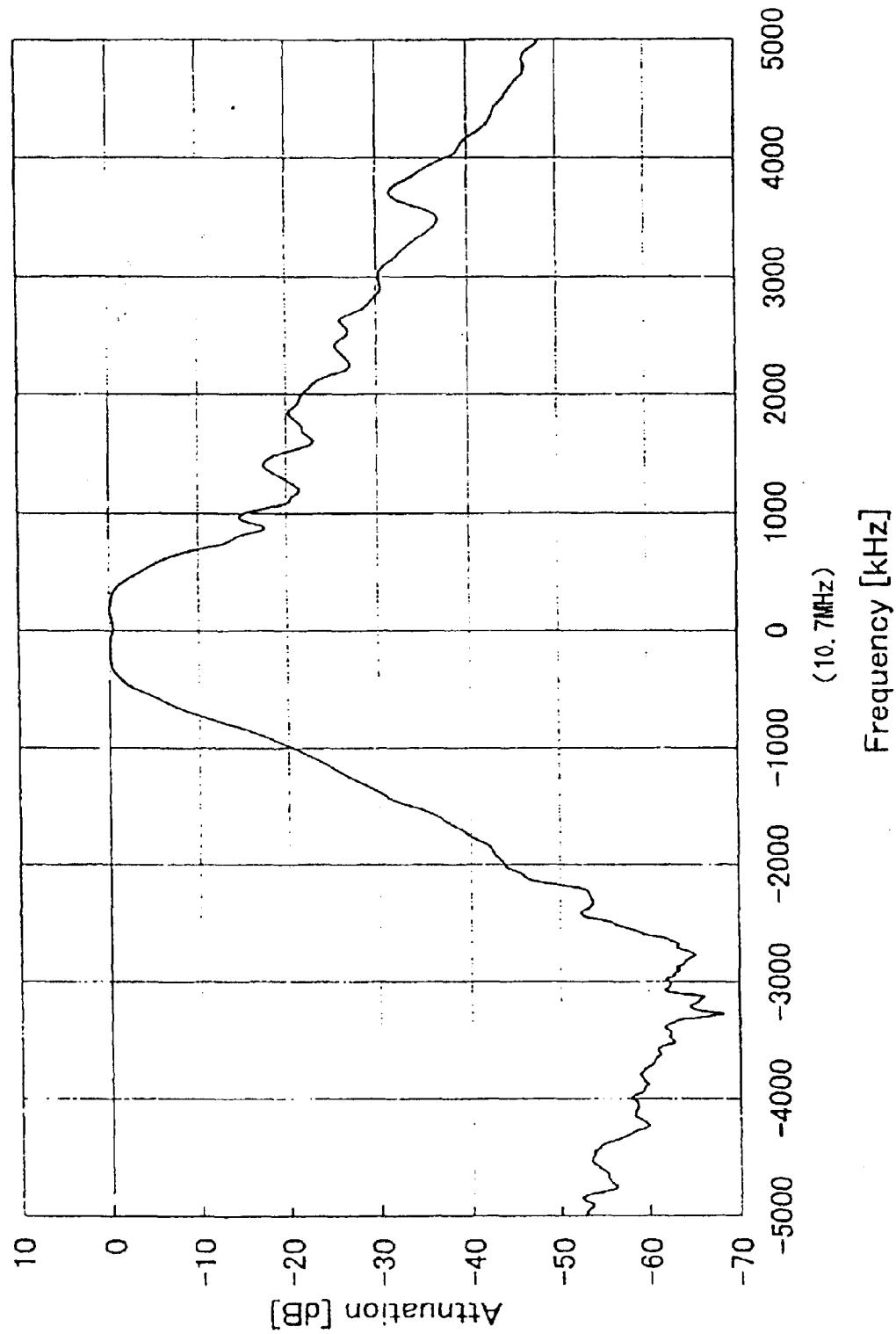
FIG. 8 is a diagram showing amplitude characteristics of the dual mode filter shown in FIG. 1 in which relay capacitors are removed.

FIG. 8 is a diagram showing amplitude characteristics of the dual mode filter shown in FIG. 1 from which the relay capacitors C1 and C2 are removed.

In this case, although out-of-band attenuation is inferior to that shown in FIG. 7, virtually no ripples are detected in the band. The two filter elements 10 and 11 show isolated effects.

Figure 9:
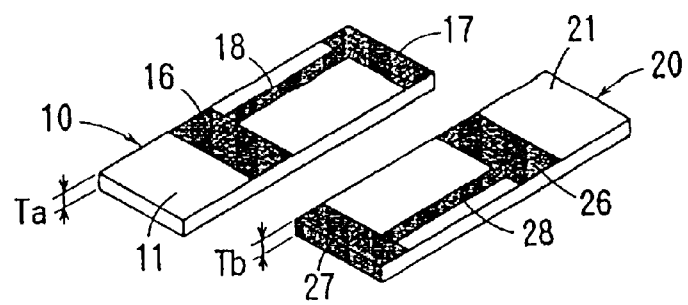
FIG. 9 is a perspective view of a filter element according to a second preferred embodiment of the present invention.

FIG. 9 shows the first and second filter elements 10 and 20 according to a second preferred embodiment of the present invention. In the second preferred embodiment, the thickness Ta of the first filter element 10 is slightly different from the thickness Tb of the second filter element 20. Specifically, the thickness Ta of the first filter element 10 is about 107.0 μm, and the thickness Tb of the second filter element 20 is about 107.2 μm. This satisfies the condition 0.99Tb<Ta<Tb.

The resonant frequency Fra of the first filter element 10 in the asymmetric mode (A mode) is about 10.720 MHz, and the resonant frequency Frb of the second filter element 20 in the asymmetric mode (A mode) is about 10.700 MHz.

Figure 10A:
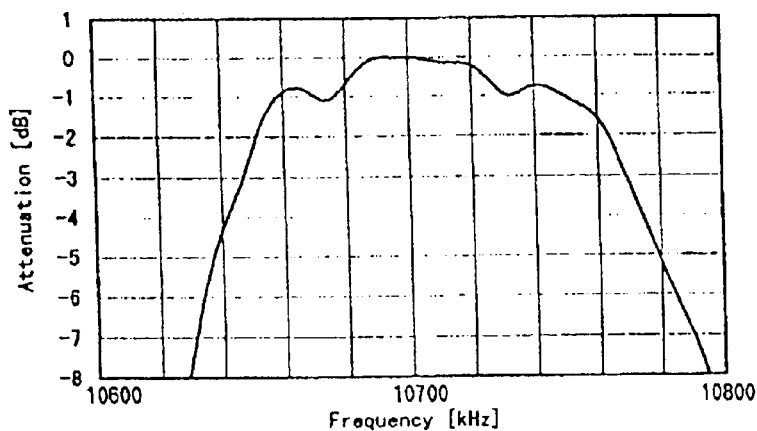
FIGS. 10A is a diagram showing amplitude characteristics of a dual mode filter using filter elements having substantially equal thicknesses.
Figure 10B:
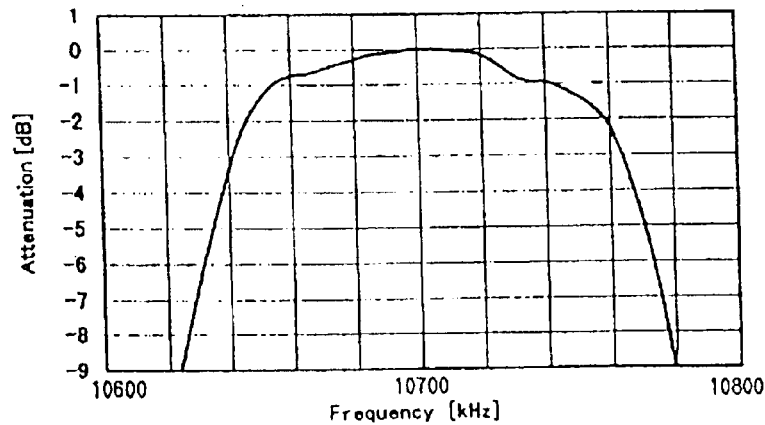
FIG. 10B is a diagram showing amplitude characteristics of a dual mode filter using filter elements having different thicknesses.

FIG. 10A shows a filter waveform when Ta=Tb. FIG. 10B shows a filter waveform when Ta=about 107.0 μm and Tb=about 107.2 μm.

As shown in FIGS. 10A and 10B, ripples are detected in the waveform in FIG. 10A, whereas virtually no ripples are detected in FIG. 10B.

Similarly, ripples are prevented from occurring when Tb<Ta<1.01Tb.

Figure 11:
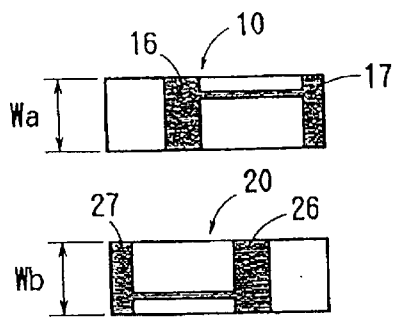
FIG. 11 is a plan view of a filter element according to a third preferred embodiment of the present invention.

FIG. 11 shows the first and second filter elements 10 and 20 according to a third preferred embodiment of the present invention.

In the third preferred embodiment, the width Wa of the first filter element 10 differs from the width Wb of the second filter element 20. Specifically, Wa=about 0.95 mm, and Wb=about 0.98 mm. This satisfies the condition 0.95 Wb<Wa<Wb.

Figure 12A:
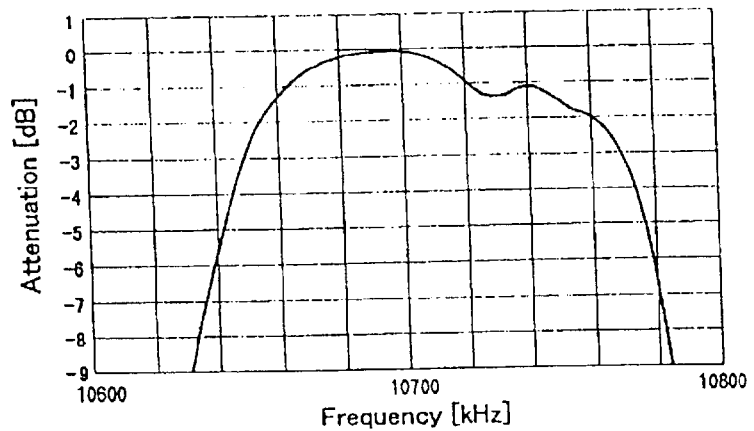
FIGS. 12A is a diagram showing amplitude characteristics of a dual mode filter using filter elements having substantially equal widths.
Figure 12B:
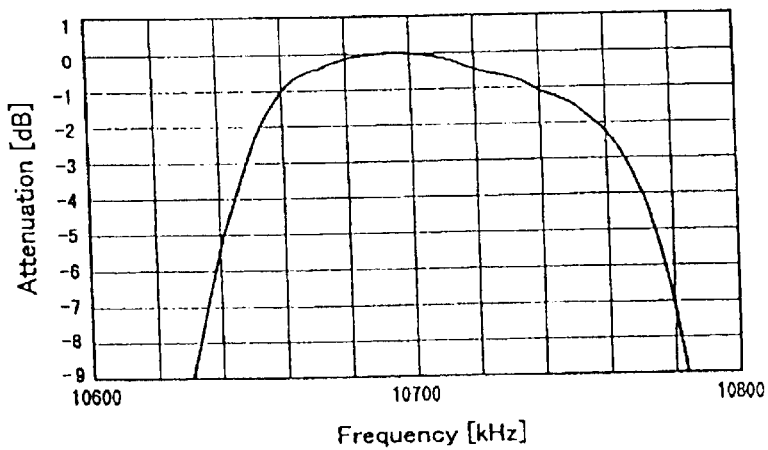
FIG. 12B is a diagram showing amplitude characteristics of a dual mode filter using filter elements having different widths.

FIG. 12A shows a filter waveform when Wa=Wb=about 0.98 mm. FIG. 12B shows a filter waveform when Wa=about 0.95 mm and Wb=about 0.98 mm, according to the third preferred embodiment.

As shown in FIGS. 12A and 12B, ripples are detected in the waveform in FIG. 12A, whereas virtually no ripples are detected in FIG. 12B.

Similarly, ripples are prevented from occurring when Wb<Wa<1.05 Wb.

In the width mode, ripples periodically occur at a ratio between the element thickness and the element width, and an appropriate width region periodically appears. By gradually changing the width of each filter element while keeping the difference in width between the two filter elements within about 5%, ripples are efficiently minimized.

Instead of using the foregoing relational expression, a combination of widths may be selected from the following appropriate width regions which periodically appear. In this case, however, the area of the vibrating electrodes may change or it may be necessary to change the chip size. For example, when an appropriate region of the element width ranges from about 0.95 mm to about 1.00 mm, and when the subsequent appropriate region ranges from about 1.20 mm to about 1.25 mm, it is necessary to select the widths of both the filter elements 10 and 20 from the range of about 0.95 mm to about 1.00 mm and to adjust the space distance between the filter elements 10 and 20. Conversely, when the width of the first filter element 10 is selected from the range of about 0.95 mm to about 1.00 mm, and the width of the second filter element is selected from the range of about 1.20 mm to about 1.25 mm, the chip size may increase. Since the areas of the vibrating electrodes differ from each other, the balance between the symmetric mode (S mode) and the asymmetric mode (A mode) produced by the two filter elements deteriorates, which causes the main waveform to be segmented.

Figure 13:
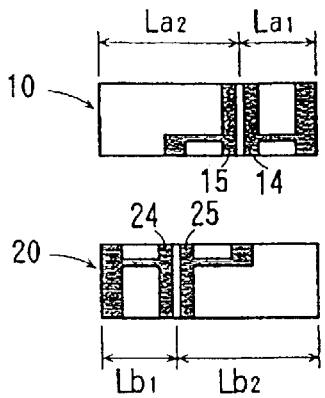
FIG. 13 is a back view of a filter element according to a fourth preferred embodiment of the present invention.

FIG. 13 shows the first and second filter elements 10 and 20 according to a fourth preferred embodiment of the present invention.

In the fourth preferred embodiment, the distance La1 from the midpoint between the segmented electrodes 14 and 15 of the first filter element 10 to one end in the longitudinal direction differs from the distance Lb1 from the midpoint between the segmented electrodes 24 and 25 of the second filter element 20 to one end in the longitudinal direction. Also, the distance La2 from the midpoint to the other end in the longitudinal direction of the first filter element 10 differs from the distance Lb2 from the midpoint to the other end in the longitudinal direction of the second filter element 20. Specifically, La1=about 0.60 mm, La2=about 1.90 mm, Lb1=about 0.65 mm, and Lb2=about 1.85 mm. Of the thicknesses of the filter elements 10 and 20, the thicker one is referred to as t (Tb=about 107.2 μm,). This satisfies the following conditions:

$$0<|La1-Lb1|<2t, \text{ and}$$

$$0<|La2-Lb2|<2t,$$

Figure 14A:
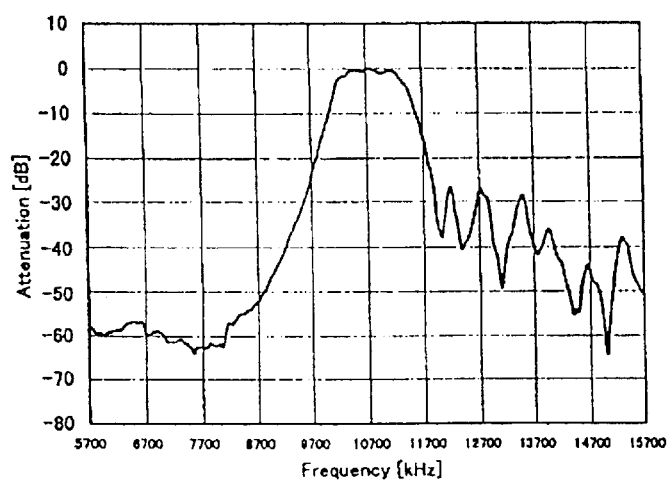
FIGS. 14A is a diagram showing amplitude characteristics of a dual mode filter using filter elements in which the distance from the midpoint between segmented electrodes to a first end in the longitudinal direction of one filter element is substantially the same as that in the other filter element.
Figure 14B:
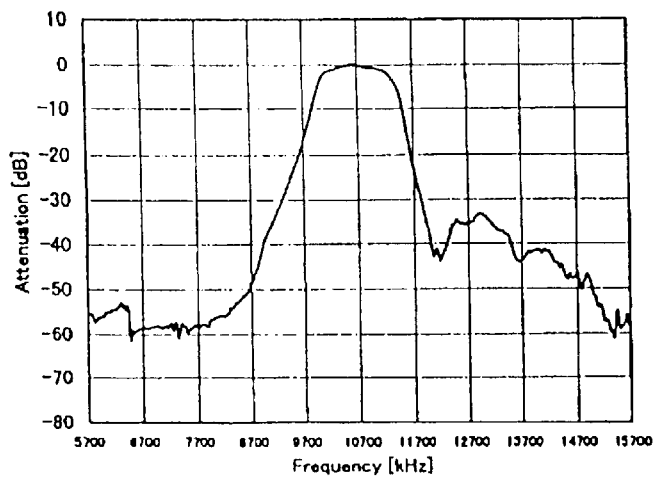
FIG. 14B is a diagram showing amplitude characteristics of a dual mode filter using filter elements in which the above distance in one filter element differs from that in the other filter element.

FIG. 14A shows a filter waveform when La1=Lb1 and La2=Lb2, that is, when La1:La2=Lb1:Lb2. FIG. 14B shows a filter waveform when La1=about 0.60 mm, La2=about 1.90 mm, Lb1=about 0.65 mm, and Lb2=about 1.85 mm according to the fourth preferred embodiment.

As shown in FIGS. 14A and FIG. 14B, ripples are detected in the waveform in FIG. 14A. In contrast, virtually no ripples are detected in FIG. 14B, and spurious responses at higher frequencies are greatly reduced.

In particular, the advantageous effects are improved by changing the ratio between La1:La2 and Lb1:Lb2.

Figure 15:
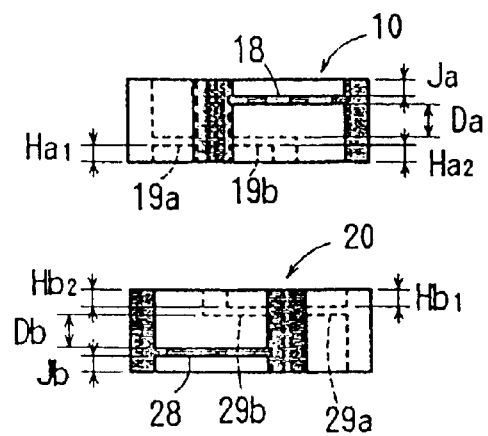
FIG. 15 is a plan view of a filter element according to a fifth preferred embodiment of the present invention.

FIG. 15 shows the first and second filter elements 10 and 20 according to a fifth preferred embodiment of the present invention.

In the fifth preferred embodiment, the minimum distance Ha1 between a first lead electrode 19a of the first filter element 10 and a first edge of the first filter element 10 in the longitudinal direction differs from the minimum distance Hb1 between a first lead electrode 29a of the second filter element 20 and a first edge of the second filter element 20 in the longitudinal direction, and the minimum distance Ha2 between a second lead electrode 19b of the first filter element 10 and the first edge of the first filter element 10 in the longitudinal direction differs from the minimum distance Hb2 between a second lead electrode 29b of the second filter element 20 and the first edge of the second filter element 20 in the longitudinal direction. Alternatively, the minimum distance Ja between the third lead electrode 18 of the first filter element 10 and a second edge of the first filter element 10 in the longitudinal direction differs from the minimum distance Jb between the third lead electrode 28 of the second filter element 20 and a second edge of the second filter element 20 in the longitudinal direction. Alternatively, the distance Da between the first lead electrode 19a and the third lead electrode 18 of the first filter element 10 differs from the distance Db between the first lead electrode 29a and the third lead electrode 28 of the second filter element 20. It is assumed that the first filter element 10 and the second filter element 20 are of substantially equal width, the first lead electrodes 19a and 29a are of substantially equal width, the second lead electrodes 19b and 29b are of substantially equal width, and the third lead electrodes 18 and 28 are of substantially equal width.

Specifically, Ha1=Ha2=about 0.30 mm, Hb1=Hb2=about 0.35 mm, Ja=about 0.05 mm, and Jb=about 0.10 mm. The width Wa of the first filter element 10 and the width Wb of the second filter element 20 are both about 1.00 mm, and the thickness of each lead electrode is about 0.15 mm. In this case, the distance Da between the lead electrodes on the top and bottom surfaces of the first filter element 10 is about 0.35 mm, and the distance Db between the lead electrodes on the top and bottom surfaces of the second filter element 20 is about 0.25 mm.

Arranged as described above, Hb−Ha=about 0.05 mm and Jb−Ja=about 0.05 mm, satisfying the conditions 0<|Ha−Hb|<W/4 and 0<|Ja−Jb|<W/4, respectively.

Figure 16A:
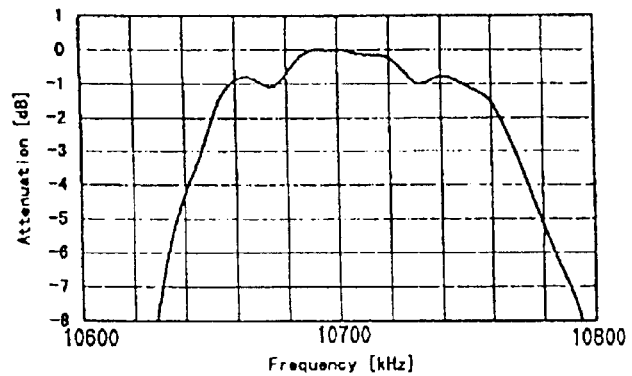
FIG. 16A is a diagram showing amplitude characteristics of a dual mode filter in which Ha1=Hb1, Ha2=Hb2, Ja=Jb, and Da=Db.
Figure 16B:
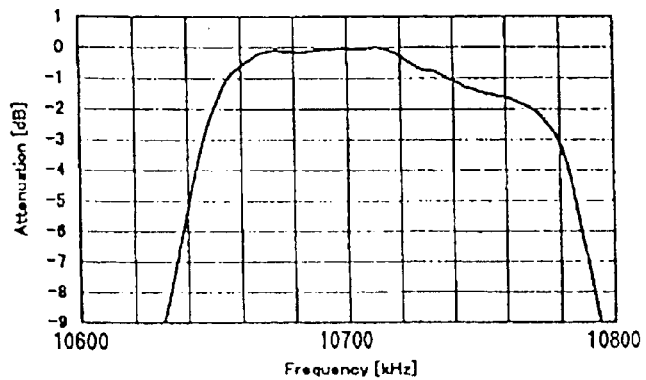
FIG. 16B is a diagram showing amplitude characteristics of a dual mode filter in which Ha1≠Hb1, Ha2≠Hb2, Ja≠Jb, and Da=Db.
Figure 17A:
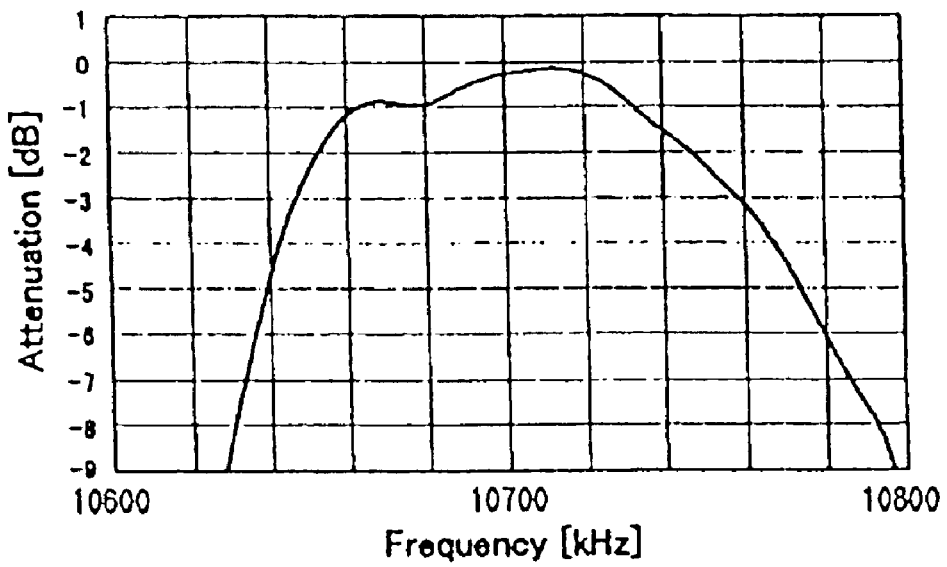
FIG. 17A is a diagram showing amplitude characteristics of a dual mode filter when Ha1=Hb1, Ha2=Hb2, Ja≠Jb, and Da≠Db.
Figure 17B:
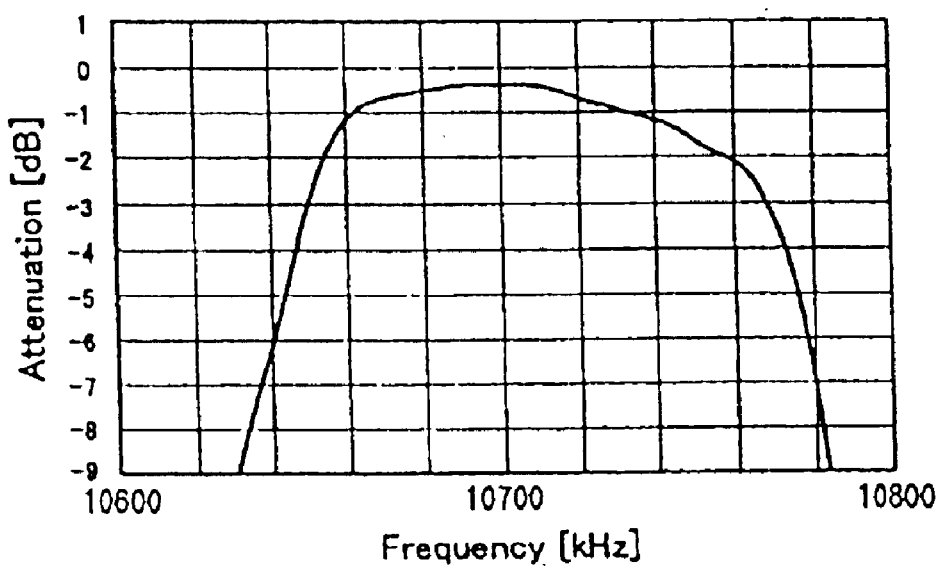
FIG. 17B is a diagram showing amplitude characteristics of a dual mode filter when Ha1≠Hb1, Ha2≠Hb2, Ja≠Jb, and Da≠Db.

FIG. 16A shows a filter waveform when Ha1=Hb1, Ha2=Hb2, Ja=Jb, and Da=Db. FIG. 16B shows a filter waveform when Ha1≠Hb1, Ha2≠Hb2, Ja≠Jb, and Da=Db. FIG. 17A shows a filter waveform when Ha1=Hb1, Ha2=Hb2, Ja≠Jb, and Da≠Db. FIG. 17B shows a filter waveform when Ha1≠Hb1, Ha2≠Hb2, Ja≠Jb, and Da≠Db. The foregoing example shown in FIG. 15 corresponds to FIG. 17B.

As shown in FIGS. 16A, 16B, 17A, and 17B, ripples are detected in the top waveform in FIG. 16A, whereas virtually no ripples are detected in FIGS. 16B, 17A, and 17B. In particular, the top waveform in FIG. 17B is the sharpest.

In the foregoing preferred embodiments, filter elements using a thickness shear vibration mode have been used as filter elements. However, the present invention is not limited to this type of filter element. The present invention is also applicable to other filter elements using other vibrations such as a thickness extensional vibration mode.

When using filter elements using a thickness shear vibration mode, the width of the filter elements is reduced. When two filter elements are arranged next to each other, the width Wc of the casing substrate 1 is effectively reduced.

The present invention is not limited to two filter elements which are arranged in parallel next to each other. Alternatively, two filter elements can be arranged lengthwise in series with each other.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A dual mode filter comprising:

a casing substrate having an input electrode, an output electrode, two ground electrodes, and a relay electrode provided thereon;

first and second filter elements mounted on the casing substrate; and a cap connected and fixed on the casing substrate so as to cover the first and second filter elements; wherein each of the first and second filter elements includes a first terminal electrode provided at a first end of a first principal surface of a piezoelectric substrate, a second terminal electrode provided in a central portion of the piezoelectric substrate, a pair of segmented electrodes provided in a portion between the first and second terminal electrodes and which are connected to the first and second terminal electrodes, respectively, a counter electrode provided on a second principal surface of the piezoelectric substrate and which is opposed to the segmented electrodes, so as to define a dual mode vibrator, and a third terminal electrode provided at a second end of the piezoelectric substrate and which is connected to the counter electrode;

the first terminal electrode of the first filter element being connected to the input electrode on the casing substrate via a conductive bonding material, and the third terminal electrode being connected to one of the two ground electrodes on the casing substrate via a conductive bonding material;

the first terminal electrode of the second filter element being connected to the output electrode on the casing substrate via a conductive bonding material, and the third terminal electrode being connected to the other of the two ground electrodes on the casing substrate via a conductive bonding material; and the second terminal electrode of the first filter element being connected to the relay electrode on the casing substrate via a conductive bonding material, and the second terminal electrode of the second filter element being connected to the relay electrode on the casing substrate via a conductive bonding material.

2. A dual mode filter according to claim 1, wherein the first and second filter elements are mounted so that each first terminal electrode, each second terminal electrode, and each of the pair of segmented electrodes face toward the casing substrate.

3. A dual mode filter according to claim 1, wherein the second terminal electrodes of the first and second filter elements are each arranged at a position near a first edge of the first principal surface of the piezoelectric surface so as not to oppose the electrodes provided on the second principal surface of the piezoelectric substrate, and the first filter element and the second filter element are arranged next to each other on the casing substrate such that the second terminal electrodes of the first filter element and the second filter element are opposed to each other.

4. A dual mode filter according to claim 1, wherein at least a thickness Ta of the first filter element differs from a thickness Tb of the second filter element.

5. A dual mode filter according to claim 4, wherein the thickness Ta of the first filter element and the thickness Tb of the second filter element satisfy one of the following relationships:

Tb<Ta<1.01Tb, and 0.99Tb<Ta <Tb.

6. A dual mode filter according to claim 1, wherein a width Wa of the first filter element differs from a width Wb of the second filter element.

7. A dual mode filter according to claim 6, wherein the width Wa of the first filter element and the width Wb of the second filter element satisfy one of the following relationships:

Wb<Wa<1.05 Wb, and 0.95Wb<Wa<Wb.

8. A dual mode filter according to claim 1, wherein a distance La1 from the midpoint between the segmented electrodes of the first filter element to a first end in the longitudinal direction, a distance La2 from the midpoint to a second end in the longitudinal direction, a distance Lb1 from the midpoint between the segmented electrodes of the second filter element to a first end in the longitudinal direction, and a distance Lb2 from the midpoint to a second end in the longitudinal direction satisfy one of the following relationships:

0<|La1−Lb1|<2t, and

0<|La2−Lb2|<2t, wherein t represents the greater of the thickness Ta of the first filter element and the thickness Tb of the second filter element.

9. A dual mode filter according to claim 1, wherein each first terminal electrode of the first and second filter terminals is connected to one of the segmented electrodes through a first lead electrode which is relatively narrow and which extends in the longitudinal direction of the filter element; each second terminal electrode is connected to the other segmented electrode through a second lead electrode which is relatively narrow and which extends in the longitudinal direction of the filter element; and each counter electrode is connected to each third terminal electrode through a third lead electrode which is relatively narrow and which extends in the longitudinal direction of the filter element, and a distance Ha1 between the first lead electrode of the first filter element and a first edge of the first filter element in the longitudinal direction and a distance Ha2 between the second lead electrode of the first filter element and the first edge of the first filter element in the longitudinal direction differ from a distance Hb1 between the first lead electrode of the second filter element and a first edge of the second filter element in the longitudinal direction and a distance Hb2 between the second lead electrode of the second filter element and the first edge of the second filter element in the longitudinal direction, respectively.

10. A dual mode filter according to claim 9, wherein the distance Ha1, the distance Ha2, the distance Hb1, the distance Hb2, and the width W of one of the first and second filter elements satisfy the following relationships:

0<|Ha1−Hb1|<W/4, and

0<|Ha2−Hb2|<W/4, wherein W represents the greater of the width Wa of the first filter element and the width Wb of the second filter element.

11. A dual mode filter according to claim 1, wherein each first terminal electrode of the first and second filter terminals is connected to one of the segmented electrodes through a first lead electrode which is relatively narrow and which extends in the longitudinal direction of the filter element; each second terminal electrode is connected to the other segmented electrode through a second lead electrode which is relatively narrow and which extends in the longitudinal direction of the filter element; and each counter electrode is connected to each third terminal electrode through a third lead electrode which is relatively narrow and which extends in the longitudinal direction of the filter element, and a distance Ja between the third lead electrode of the first filter element and a first edge of the first filter element in the longitudinal direction differs from a distance Jb between the third lead electrode of the second filter element and a first edge of the second filter element in the longitudinal direction.

12. A dual mode filter according to claim 11, wherein the distance Ja, the distance Jb, and the width W of one of the first and second filter elements satisfy the following relationships:

0<|Ja−Jb|<W/4 wherein W represents the greater of the width Wa of the first filter element and the width Wb of the second filter element.

13. A dual mode filter according to claim 1, each first terminal electrode of the first and second filter terminals is connected to one of the segmented electrodes through a first lead electrode which is relatively narrow and which extends in the longitudinal direction of the filter element; each second terminal electrode is connected to the other segmented electrode through a second lead electrode which is relatively narrow and which extends in the longitudinal direction of the filter element; and each counter electrode is connected to each third terminal electrode through a third lead electrode which is relatively narrow and which extends in the longitudinal direction of the filter element, the first and second lead electrodes and the third lead electrode of the first filter element are provided at unopposed positions on top and bottom surfaces of the first filter element;

the first and second lead electrodes and the third electrode of the second filter element are provided at unopposed positions on top and bottom surfaces of the second filter element, and a distance Da in the width direction between the first and second lead electrodes and the third lead electrode of the first filter element differs from a distance Db in the width direction between the first and second lead electrodes and the third lead electrode of the second filter element.

14. A dual mode filter according to claim 1, wherein the casing substrate includes a dielectric multilayer product including therein a plurality of capacitance electrodes;

at least one of the capacitance electrodes being connected to the relay electrode; and at least another one of the capacitance electrodes being connected to the ground electrodes.

15. A dual mode filter according to claim 1, wherein the casing substrate is quadrangular;

the input electrode and the output electrode are provided at opposing corners of the casing substrate;

the two ground electrodes are provided at the remaining opposing corners;

the third terminal electrode of the first filter element is connected to one of the two ground electrodes on the casing substrate; and the third terminal electrode of the second filter element is connected to the other of the two ground electrodes on the casing substrate.

16. A dual mode filter according to claim 1, wherein the relay electrode includes a strip extending in a narrow side direction of the casing substrate.

17. A dual mode filter according to claim 1, wherein at least two capacitance electrodes are provided in an interior of the casing substrate.

18. A dual mode filter according to claim 17, wherein each of the at least two capacitance electrodes includes two electrode portions extending to opposing edges of the casing substrate, and a connecting portion that connects the two electrode portions, said two electrode portions being extending continuously with said two ground electrodes.

19. A dual mode filter according to claim 1, wherein the resonant frequencies of the first and second filter elements are substantially the same.

20. A dual mode filter according to claim 1, further comprising an insulating layer provided on the casing substrate such that the cap is connected and fixed on the insulating layer.

* * * * *